(12) United States Patent
Sawada

(10) Patent No.: US 8,168,956 B2
(45) Date of Patent: May 1, 2012

(54) SCANNING TRANSMISSION ELECTRON MICROSCOPE AND METHOD OF ABERRATION CORRECTION THEREFOR

(75) Inventor: Hidetaka Sawada, Tokyo (JP)

(73) Assignee: JEOL Ltd., Tokyo (JP)

( * ) Notice: Subject to any disclaimer, the term of this patent is extended or adjusted under 35 U.S.C. 154(b) by 458 days.

(21) Appl. No.: 12/400,891

(22) Filed: Mar. 10, 2009

(65) Prior Publication Data
US 2009/0224169 A1 Sep. 10, 2009

(30) Foreign Application Priority Data
Mar. 10, 2008 (JP) .................... 2008-60266

(51) Int. Cl.
*H01J 37/153* (2006.01)
*H01J 37/08* (2006.01)

(52) U.S. Cl. ...................... 250/396 R; 250/310; 250/311

(58) Field of Classification Search .................. 250/311, 250/306, 307, 310
See application file for complete search history.

(56) References Cited

U.S. PATENT DOCUMENTS

| | | | | |
|---|---|---|---|---|
| 4,414,474 A * | 11/1983 | Crewe | ...................... | 250/396 R |
| 4,618,766 A * | 10/1986 | van der Mast et al. | ....... | 250/311 |
| 4,820,921 A * | 4/1989 | Bakker et al. | ................. | 250/307 |
| 5,798,524 A * | 8/1998 | Kundmann et al. | ........... | 250/305 |
| 6,067,164 A * | 5/2000 | Onoguchi et al. | ............ | 356/401 |
| 6,333,510 B1 * | 12/2001 | Watanabe et al. | ........ | 250/559.27 |
| 6,605,810 B1 * | 8/2003 | Haider et al. | ............. | 250/396 R |
| 7,060,986 B2 * | 6/2006 | Nakamura et al. | ........ | 250/396 R |
| 7,385,205 B2 * | 6/2008 | Pearl | .......................... | 250/491.1 |
| 7,619,220 B2 * | 11/2009 | Sawada et al. | ................ | 250/311 |
| 2005/0247884 A1 * | 11/2005 | Nakamura et al. | ........ | 250/396 R |
| 2007/0120055 A1 * | 5/2007 | Sawada et al. | ................ | 250/307 |
| 2007/0235659 A1 * | 10/2007 | Pearl | ............................. | 250/397 |

FOREIGN PATENT DOCUMENTS

JP 2002-075262 3/2002

* cited by examiner

*Primary Examiner* — Nikita Wells
*Assistant Examiner* — Johnnie L Smith
(74) *Attorney, Agent, or Firm* — The Webb Law Firm

(57) ABSTRACT

A scanning transmission electron microscope (STEM) and method of aberration correction have autocorrelation function calculation means, aberration coefficient calculation means, and feedback control. At least two images are obtained by varying a value at which one of the electron optical means is set. The at least two images are autocorrelated. Iso-intensity lines are fit to aberration functions. Aberration coefficients are obtained based on aberration functions. The feedback controls the electron optical column.

8 Claims, 7 Drawing Sheets

REGION A $P_x = k \cdot o_2 \cdot \cos(\Theta) + k \cdot a_2 \cos(\Theta - 2\Theta_{a2})$
$P_y = k \cdot o_2 \cdot \sin(\Theta) - k \cdot a_2 \sin(\Theta - 2\Theta_{a2})$

REGION B $$P_x = k \cdot (o_2 + do_2) \cdot \cos(\Theta) + k \cdot o_2 \cos(\Theta - 2\Theta_{a2})$$
$$P_y = k \cdot (o_2 - do_2) \cdot \sin(\Theta) - k \cdot o_2 \sin(\Theta - 2\Theta_{a2})$$

SCANNING TRANSMISSION ELECTRON MICROSCOPE AND METHOD OF ABERRATION CORRECTION THEREFOR

BACKGROUND OF THE INVENTION

1. Field of the Invention

The present invention relates to an aberration correction system and method of aberration correction used in a scanning transmission electron microscope and, more particularly, to an aberration correction system and method of aberration correction using autocorrelation functions.

2. Description of Related Art

It is very important to correct aberrations produced by the electron optical system of a scanning transmission electron microscope (STEM) in enhancing the resolution of the microscope. Various methods are available for the aberration correction. Among them, a method of aberration correction using an image is disclosed in JP-A-2002-75262. This method is now described.

First, an image A is obtained under a well focused condition. An image B is obtained under an underfocused condition. An image C is obtained under an overfocused condition. The images A, B, and C are Fourier-transformed to give rise to spatial frequency distributions A', B', and C', respectively. Then, the spatial frequency distributions B' and C' are divided by the spatial frequency distribution A'. The quotients are inverse-Fourier transformed.

Information about spatial frequencies regarding an observed specimen contained in the image is removed by processing the image in this way. Only aberration information about the electron beam (or the probe) is extracted. Accordingly, aberrations are corrected by manipulating the aberration corrector or deflector based on the aberration information.

In the STEM imaging mode, it is impossible to perform aberration correction by the prior-art method of aberration correction under the condition where an STEM image is being acquired using a Ronchigram or the like. Especially, when high-resolution imaging for imaging atoms or two-dimensional mapping using energy-dispersive X-ray spectroscopy (EDS) or electron energy loss spectroscopy (EELS) is done, it takes a long time to acquire data in many cases. During this time interval, defocus and two-fold astigmatism vary. In this case, the prior-art method of aberration correction that involves interruption of observation cannot be employed. Therefore, it is inevitable that the acquired data will deteriorate in spatial resolution.

SUMMARY OF THE INVENTION

Accordingly, it is an object of the present invention to provide a scanning transmission electron microscope and method of aberration correction which can correct defocus and astigmatism during imaging and which can provide atomic resolution.

The present invention has been made to achieve the foregoing object.

A first embodiment of the present invention provides a scanning transmission electron microscope (STEM) equipped with plural electron optical devices including an aberration corrector. The STEM has: autocorrelation function calculation means for calculating autocorrelation functions of at least two images obtained at different foci; aberration coefficient calculation means for fitting aberration functions to iso-intensity lines of the autocorrelation functions and calculating aberration coefficients based on the obtained aberration functions; and feedback control system for providing feedback control of the electron optical column based on the aberration coefficients.

The aberration coefficients may represent defocus and two-fold astigmatism.

The feedback control system may control any one or more of components included in the electron optical devices, such as an objective lens and aberration corrector.

A second embodiment of the present invention provides a method of aberration correction implemented in a scanning transmission electron microscope having plural electron optical devices including an aberration corrector. The method starts with obtaining at least two images at different foci. Autocorrelation functions of the images are calculated. Aberration functions are fitted to iso-intensity lines of the autocorrelation functions. Based on the obtained aberration functions, aberration coefficients are calculated. Feedback control of the plural electron optical devices is provided based on the aberration coefficients.

A third embodiment of the present invention provides a method of aberration correction implemented in a scanning transmission electron microscope having plural electron optical devices including an aberration corrector. The method starts with obtaining at least two images under different settings of an angular region equivalent to tilting of an incident electron beam. Autocorrelation functions of the images are calculated. Aberration functions are fitted to iso-intensity lines of the autocorrelation functions. Based on the obtained aberration functions, aberration coefficients are calculated. Based on the aberration coefficients, feedback control of the plural electron optical devices is provided.

In any of the methods of aberration correction, the aberration coefficients may represent defocus and two-fold astigmatism.

In the scanning transmission electron microscope and method of aberration correction of the present invention, defocus and aberrations, such as astigmatism, can be corrected during imaging.

Accordingly, in high-resolution imaging applications where deviation of a desired region being observed presents serious problems, aberration correction can be made without losing the desired observed image.

Furthermore, aberration calculation results can be obtained immediately. This enables automatic in-site aberration correction. As a result, good quality data can be obtained without deteriorating the spatial resolution in EDS (energy dispersive spectroscopy) and EELS imaging applications where long-term accumulation of data is necessary.

Other objects and features of the invention will appear in the course of the description thereof, which follows.

DESCRIPTION OF THE PREFERRED EMBODIMENTS

Figure 1:
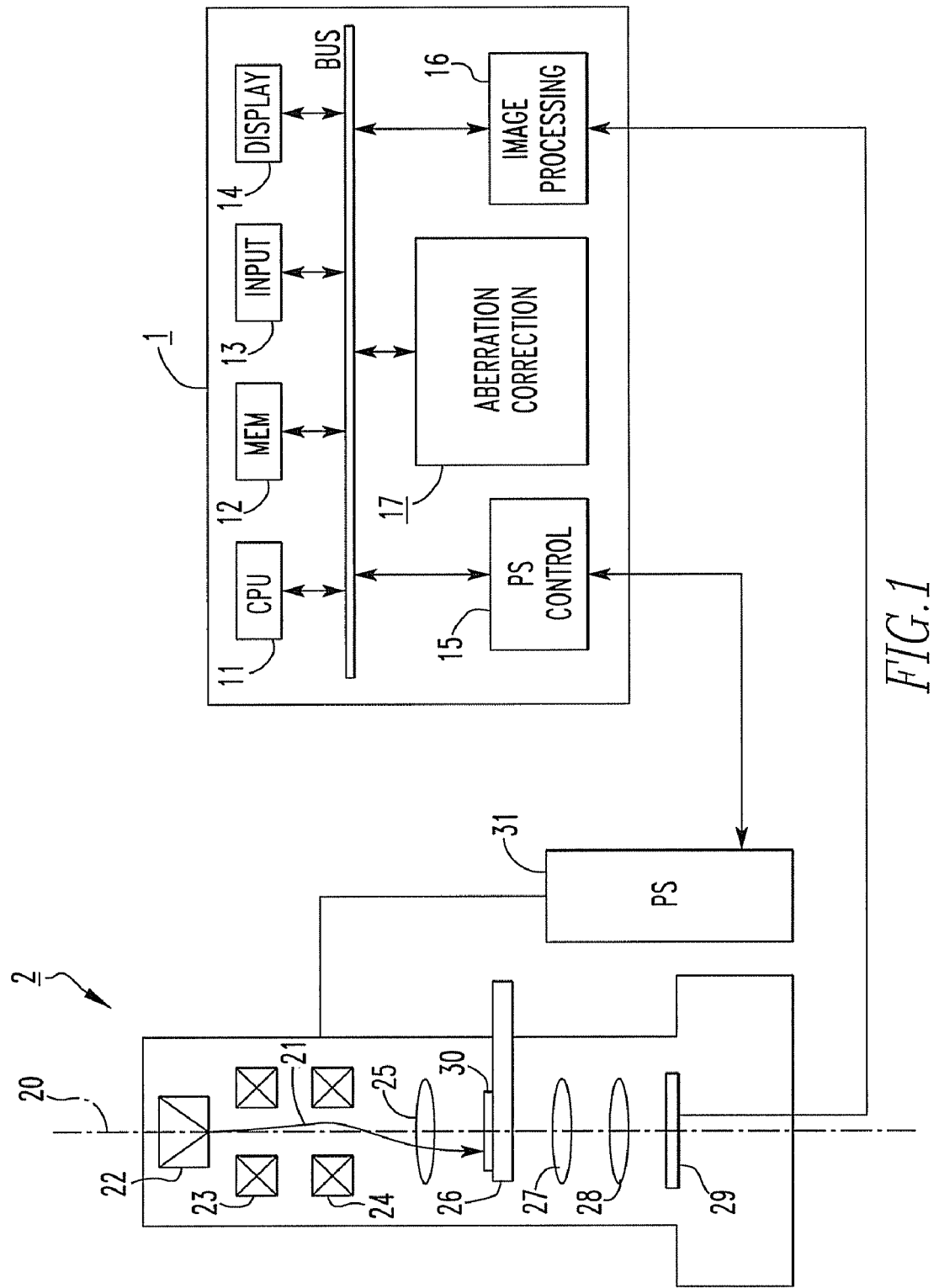
FIG. 1 is a block diagram of an aberration correction controller which is associated with one embodiment of the present invention and which is for use with a scanning transmission electron microscope (STEM)

Embodiments of the aberration correction system and method of aberration correction associated with the present invention are hereinafter described with reference to the drawings. In the following embodiments, a scanning transmission electron microscope (STEM) is used. FIG. 1 is a block diagram of an aberration correction system for use with the STEM associated with the embodiments. The STEM is generally indicated by reference numeral 2.

A controller 1 forms the aberration correction system associated with the present invention. The controller 1 also acts to perform control operations for normal imaging. The controller 1 has a CPU (central processing unit) 11 and memory storage 12 including a memory and a hard disk. The CPU 11 forms a computer. Furthermore, the controller 1 has an input portion 13 forming an interface with the memory storage, a display portion 14, a power supply control portion 15, an image processing portion 16, and an aberration correction processing portion 17. The input portion 13 includes a mouse and a keyboard. The aberration correction processing portion 17 corrects aberrations in the STEM 2 based on image data derived from the image processing portion 16. These portions are interconnected by a bus such that various kinds of data and control instructions are input into and output from the portions.

Based on a program executed by the CPU 11, the power supply control portion 15 electrically controls power supplies connected with the electron optical devices of the STEM 2 (i.e., electron lenses, deflector, and aberration corrector) and with a specimen stage, respectively. Values previously stored in memory storage based on the executed program and values entered through the input portion 13 are used as data set into the electron optical column.

During observation of a specimen 30, the output signal from a detector 29 mounted in the STEM 2 is converted into image data by the image processing portion 16. The obtained image data is stored in the memory storage 12 and displayed as a final image on the display portion. The image data is also used for processing for aberration correction (described later).

Meanwhile, the STEM 2 has an electron gun 22, an aberration corrector 23, a deflector 24, an objective lens 25, the specimen stage 26, an intermediate lens 27, a projector lens 28, and the detector 29. These electron optical column devices are mounted along an optical axis 20. A system of condenser lenses (not shown) is mounted between the electron gun 22 and the objective lens 25 to converge the electron beam.

The STEM 2 further includes a power supply portion 31 having plural power supplies (not shown) for applying currents or voltages to the lenses, aberration corrector, deflector, and other components. The values of the currents or voltages are determined based on set values that are output from the power supply control portion 15.

After an electron beam 21 emitted from the electron gun 22 is accelerated, the beam is condensed by the system of condenser lenses (not shown), further condensed by the objective lens 25, and made to hit the specimen 30. The beam 21 is condensed into a diameter of the order of nanometers by the system of condenser lenses and objective lens 25. At this time, astigmatism is produced. The astigmatism is corrected by the aberration corrector 23. As a result, a desirably very fine electron beam is obtained. The aberration corrector 23 is made up of multipole elements producing electric or magnetic fields or superimposed electric and magnetic fields.

The electron beam 21 is deflected by the deflector 24 while being condensed by the system of condenser lenses. Thus, the beam is scanned over the specimen 30. The electron beam 21 transmitted through the specimen 30 while being scattered is magnified and projected onto the detector 29 by the intermediate lens 27 and projector lens 28.

The electrons transmitted through the specimen 30 while being scattered are detected by the detector 29. The detector 29 produces an output signal to the image processing portion 16 of the controller 1. This signal is processed within the controller 1 and stored as image data into the memory storage 12 as mentioned previously and displayed as an STEM image on the display portion 14. The detector 29 is split into a disk-like part centered at the optical axis 20 and an annular part in the same way as in a general STEM. The output signal from the disk-like detector part forms a bright-field image, while the output signal from the annular detector part forms a dark-field image.

The spatial resolution of the formed image heavily depends on the diameter, beam profile, angle of incidence, and other parameters of the electron beam 21 hitting the specimen 30. Therefore, it is important to correct defocus and astigmatism produced by inappropriate settings of the electron optical system.

The principle of aberration correction associated with the present invention is described by referring to FIGS. 2-7. In the following description, aberrations are corrected using a dark-field image as an embodiment of the present invention. In the aberration correction of the present invention, the coherence of the electron beam forming the image does not matter and, therefore, a bright-field image may also be used. In any image, aberrations can be corrected by obtaining iso-intensity lines of autocorrelation functions (described later).

Generally, a dark-field image I produced by STEM is a convolution between a specimen function S of the specimen 30 and a probe function P indicating the intensity distribution of the electron beam (also referred to as the probe) 21 on the specimen. Let * be a convolution operator. The dark-field image I is given by $$I = S * P \quad (1)$$

Therefore, an autocorrelation function $R_{ac}$ of the dark-field image I can be represented as $$R_{ac} = F^{-1}[|F[I]|^2] = F^{-1}[|F[S*P]|^2] = F^{-1}[|F[S]|^2 \cdot |F[P]|^2] \quad (2)$$

where F and $F^{-1}$ are mathematical operators indicating Fourier transform and inverse Fourier transform, respectively.

It is assumed that the specimen function is represented by a delta function, such as atomic potential (atomic column potential). Because the Fourier transform of the delta function is unity, Eq. (2) is changed into:

$$R_{ac}=F^{-1}[F[S]^2 \cdot F[P]^2]=F^{-1}[1^2 \cdot F[P]^2]=F^{-1}[F[P]^2] \quad (3)$$

Therefore, it can be seen that the autocorrelation function $R_{ac}$ of the dark-field image I depends on the probe function P.

Furthermore, it is assumed that a probe function used when astigmatism and defocusing occur is a Gaussian function. Let k be a proportionality coefficient. Eq. (3) can be reduced to $$R_{ac}=kP^2 \quad (4)$$

That is, when a dark-field image is being observed at atomic resolution, the autocorrelation function $R_{ac}$ obtained based on the above equation is in proportion to the intensity of the probe.

On the other hand, where the probe function P contains two kinds of aberrations, i.e., defocus and two-fold astigmatism, iso-intensity lines (contour lines) in the autocorrelation function of the dark-field image obtained at a focus are represented by an aberration function having coordinate values given by $$P_x = k \cdot o_2 \cdot \cos(\theta) + k \cdot a_2 \cos(\theta - 2\theta_{a2})$$

$$P_y = k \cdot o_2 \cdot \sin(\theta) - k \cdot a_2 \sin(\theta - 2\theta_{a2}) \quad (5)$$

the coordinate values being planar coordinates representing the autocorrelation function. In the planar coordinate, $P_x$ indicates the displacement of the probe in the x-axis direction due to the aberration. Similarly, $P_y$ indicates the displacement of the probe in the y-axis direction. $o_2$ is an aberration coefficient indicating defocus appearing in the electron optical system. $a_2$ is a two-fold astigmatism coefficient. $\theta_{a2}$ is the azimuthal angle of the two-fold astigmatism.

Iso-intensity lines (contour lines) in the autocorrelation function $R_{ac}$ obtained at another focus are represented by an aberration function having coordinate values given by $$P_x = k \cdot (o_2 + do_2) \cdot \cos(\theta) + k \cdot a_2 \cos(\theta - 2\theta_{a2})$$

$$P_y = k \cdot (o_2 + do_2) \cdot \sin(\theta) - k \cdot a_2 \sin(\theta - 2\theta_{a2}) \quad (6)$$

the coordinate values being planar coordinates representing the autocorrelation function. The $do_2$ indicates the difference in defocus between the two foci.

Accordingly, if the aberration functions based on Eqs. (5) and (6), respectively, are fitted to the dark-field images obtained at two different foci, the coefficients $o_2$, $a_2$, and k are immediately found.

Figure 2:
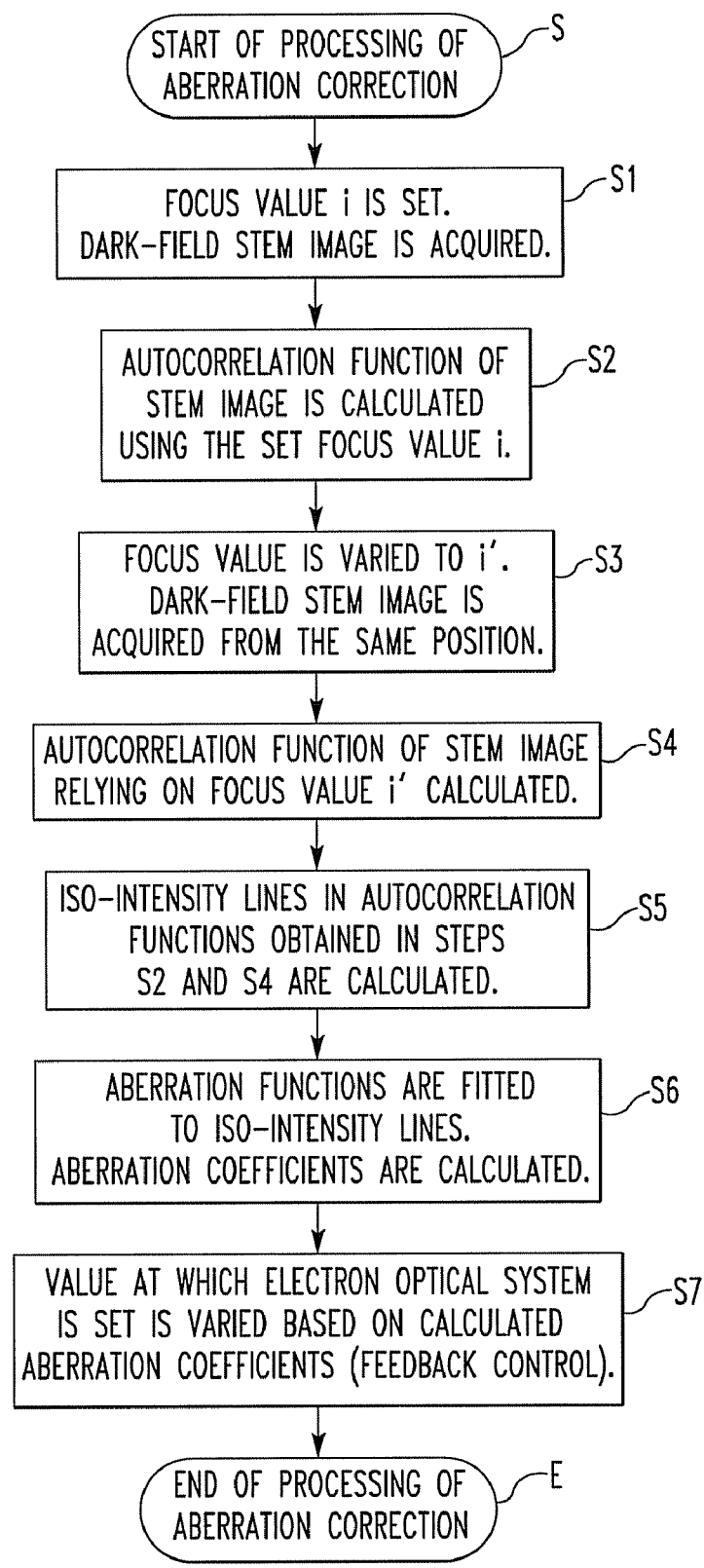
FIG. 2 is a flowchart illustrating aberration correction, according to one embodiment of the present invention.

Processing of aberration correction based on this principle is described. FIG. 2 is a flowchart illustrating the processing of the aberration correction.

Figure 3:
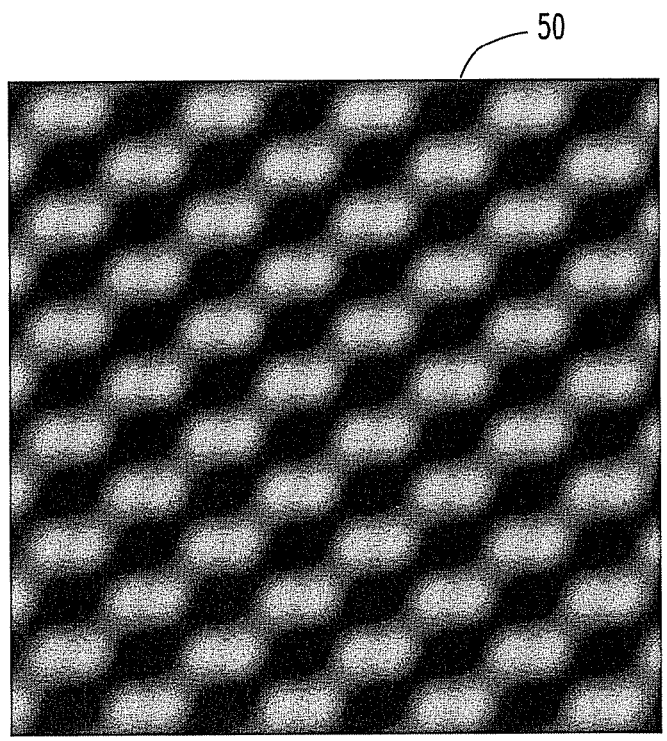
FIG. 3 is a dark-field image acquired, according to one embodiment of the present invention.

First, the electron optical column devices of the STEM 2 are manipulated to set the microscope to the state where atomic resolution is obtained. A dark-field STEM image 50 of columns of atoms as shown in FIG. 3 is obtained (step S1). At this time, the objective lens 25 is set to a focus value of i.

Figure 4:
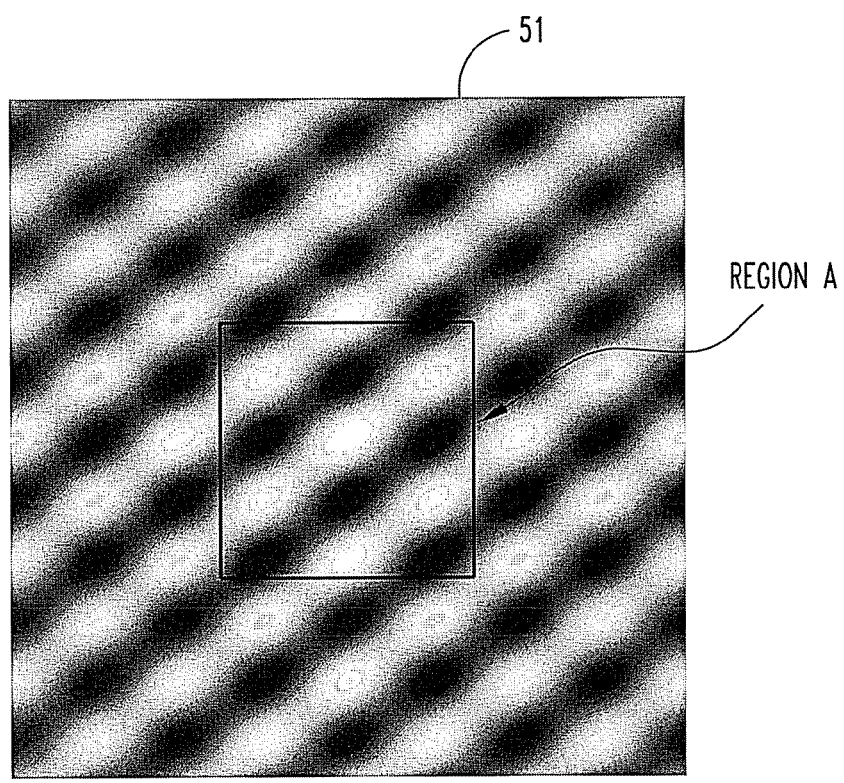
FIG. 4 shows an autocorrelation function of the dark-field image shown in FIG. 3.

The autocorrelation function 51 of the dark-field image 50 obtained in step S1 is calculated based on Eq. (2) (step S2). FIG. 4 shows the result of calculation of the autocorrelation function 51 from the dark-field image 50 shown in FIG. 3.

Figure 6:
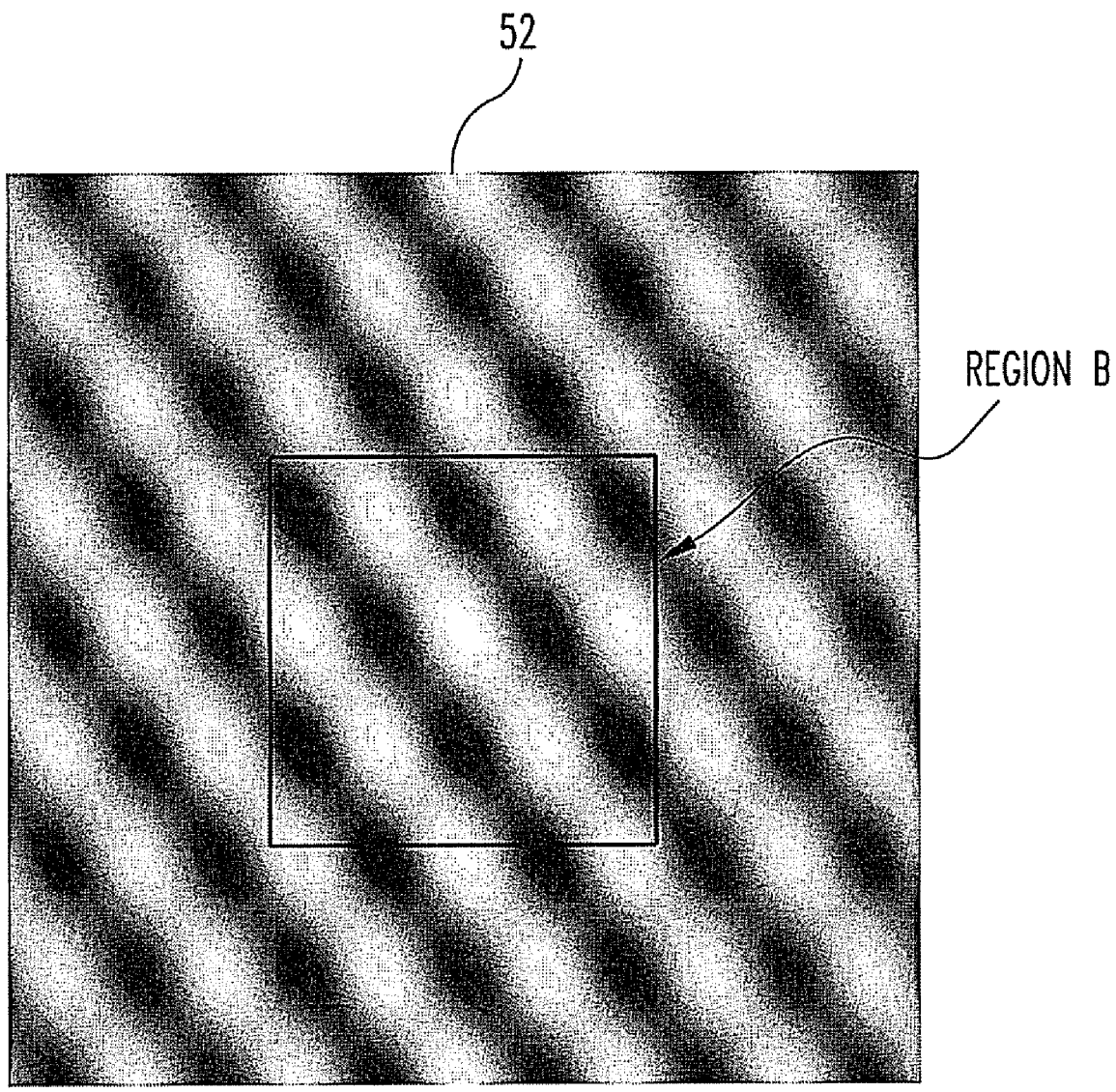
FIG. 6 shows an autocorrelation function acquired, according to one embodiment of the present invention, under focal conditions different from the conditions under which the autocorrelation function shown in FIG. 4 is obtained.

Then, the focus value is varied to i'. A dark-field STEM image of columns of atoms is acquired (step S3). Furthermore, the autocorrelation function of the obtained dark-field image is calculated (step S4). FIG. 6 indicates the autocorrelation function 52 calculated in step S4.

At this point, dark-field images and corresponding autocorrelation functions are obtained at the two different focus values i and i'. As mentioned previously, the contrasts of the autocorrelation functions 51 and 52 shown in FIGS. 4 and 6 indicate defocus and two-fold astigmatism appearing in the probe function.

In the autocorrelation functions 51 and 52, given regions (e.g., central region A of FIG. 4 and central region B of FIG. 6) are selected. Iso-intensity lines 53 and 54 in the regions A and B are calculated (step S5). The aberration function given by Eq. (5) is fitted to the iso-intensity lines 53 and 54 using the least squares method. The coefficients $o_2$, $a_2$, and k are calculated (step S6).

Figure 5A:
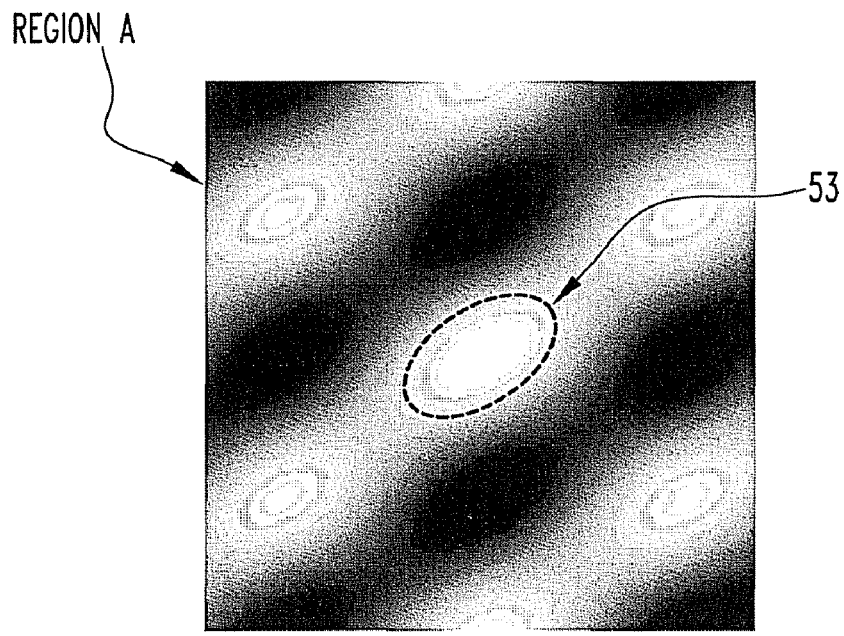
FIG. 5A is an enlarged view of the autocorrelation function shown in FIG. 4, depicting one example of iso-intensity line.
Figure 5B:
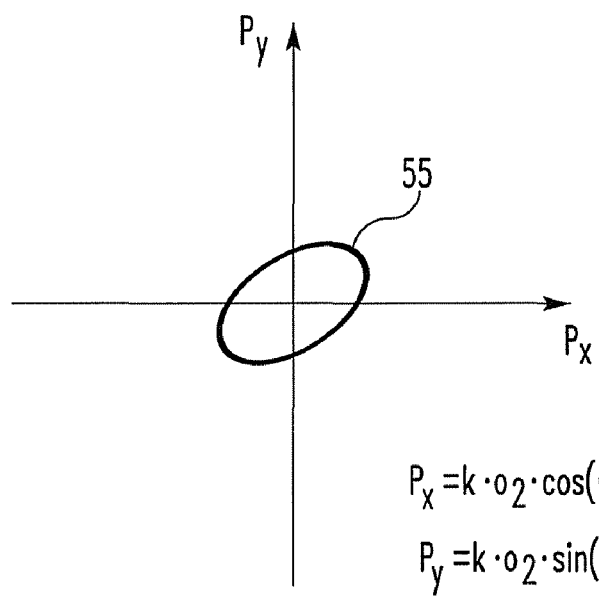
FIG. 5B is a graph illustrating an aberration function obtained by applying a fitting technique to the iso-intensity line of FIG. 5A.
Figure 7A:
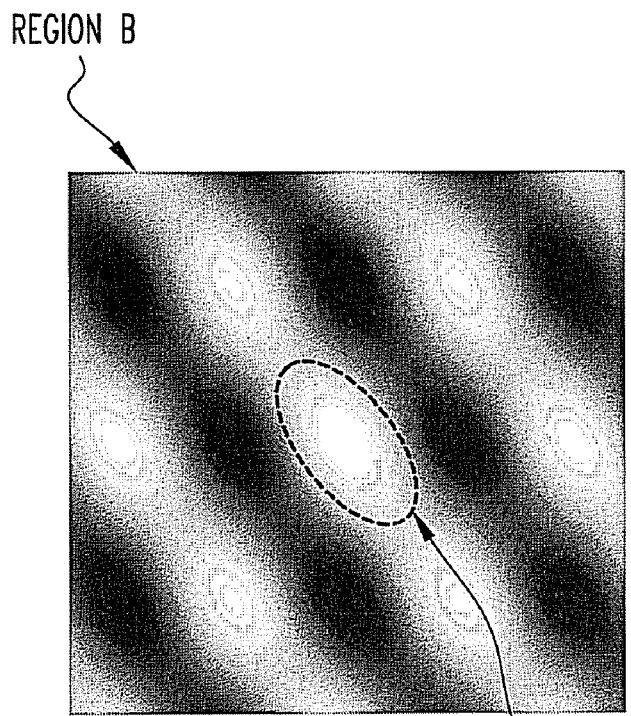
FIG. 7A is an enlarged view of the autocorrelation function shown in FIG. 6, depicting one example of iso-intensity line.
Figure 7B:
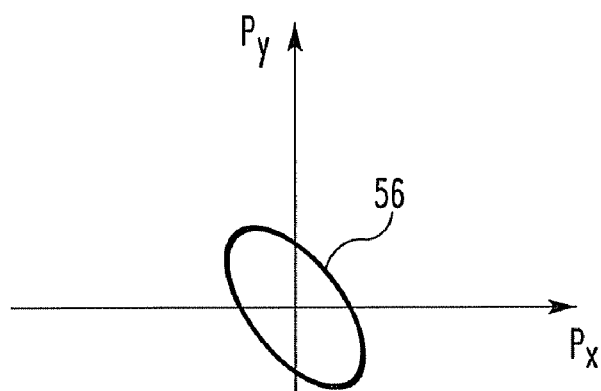
FIG. 7B is a graph illustrating an aberration function obtained by applying a fitting technique to the iso-intensity line of FIG. 7A.

In FIG. 5A, the iso-intensity line 53 in the region A of FIG. 4 is indicated by the dotted line. FIG. 5B indicates the aberration function 55 calculated from the result of the fitting to the iso-intensity line 53 using Eq. (5). Similarly, in FIG. 7A, the iso-intensity line 54 calculated in the region B of FIG. 6 is indicated by the dotted line. FIG. 7B indicates the aberration function 56 calculated from the result of the fitting to the iso-intensity line 54 using Eq. (6). In the present embodiment, the regions from which the iso-intensity lines are calculated are specified to be central regions of the autocorrelation functions as shown in FIGS. 5A and 7A. Other regions may also be specified. Furthermore, plural iso-intensity lines each forming a closed curve may be selected. Aberration functions based on Eqs. (5) and (6), respectively, may be fitted to the selected iso-intensity lines. In this case, the average value of aberration coefficients calculated with each aberration function is used in the processing of the next step S7.

In step S6, the aberration coefficients $o_2$ and $a_2$ have already been obtained from the aberration functions 55 and 56. Feedback control is provided to modify the values at which the objective lens 25 and aberration corrector 23 are set, to cancel out the presently produced aberrations using these values (step S7). As a result, a dark-field image where the electron beam 21 has been optimally focused and two-fold astigmatism has been removed is obtained.

The fitting and calculation of the aberration coefficients in steps S5, S6 may be performed separately immediately after acquisition of the autocorrelation functions of each dark-field image, i.e., immediately after steps S2 and S4.

If the electron beam 21 not yet incident on the specimen 30 is tilted, comatic aberrations occur. It is known that such comatic aberrations appear as two-fold astigmatism and defocus in a microscope image (see, for example, F. Zemlin, K. Weiss, P. Schiske, W. Kunath, and K. H. Herrmann, *Ultramicroscopy* Vol. 3 (1978), pp. 46-60; and S. Uhlemann and M. Haider, *Ultramicroscopy* Vol. 72 (1998), pp. 109-119). We take notice of comatic aberration coefficient $P_3$, for example. It is assumed that the amount of tilt of the electron beam 21 with respect to the specimen 30 and its complex conjugate are respectively given by $$T, \overline{T}$$

The defocus $o_2$ and two-fold astigmatism aberration coefficients $a_2$ vary by amounts respectively given by $$o_2 = \frac{4}{3}\text{Re}(P_3 \overline{T}) \quad (7)$$

$$a_2 = \frac{2}{3}P_3 T$$

Therefore, in the processing of steps S1-S4, if the incident angle of the electron beam 21 with respect to the specimen 30 is varied, for example, using the deflector 24 instead of varying the focus value and performing the processing of steps S5-S7, the comatic aberration coefficient $P_3$ can be calculated. During imaging using the electron beam 21 tilted relative to the specimen 30, if the processing of aberration processing of the present invention is performed in this way, higher-order aberrations, such as comatic aberrations, can also be measured.

Figure 8:
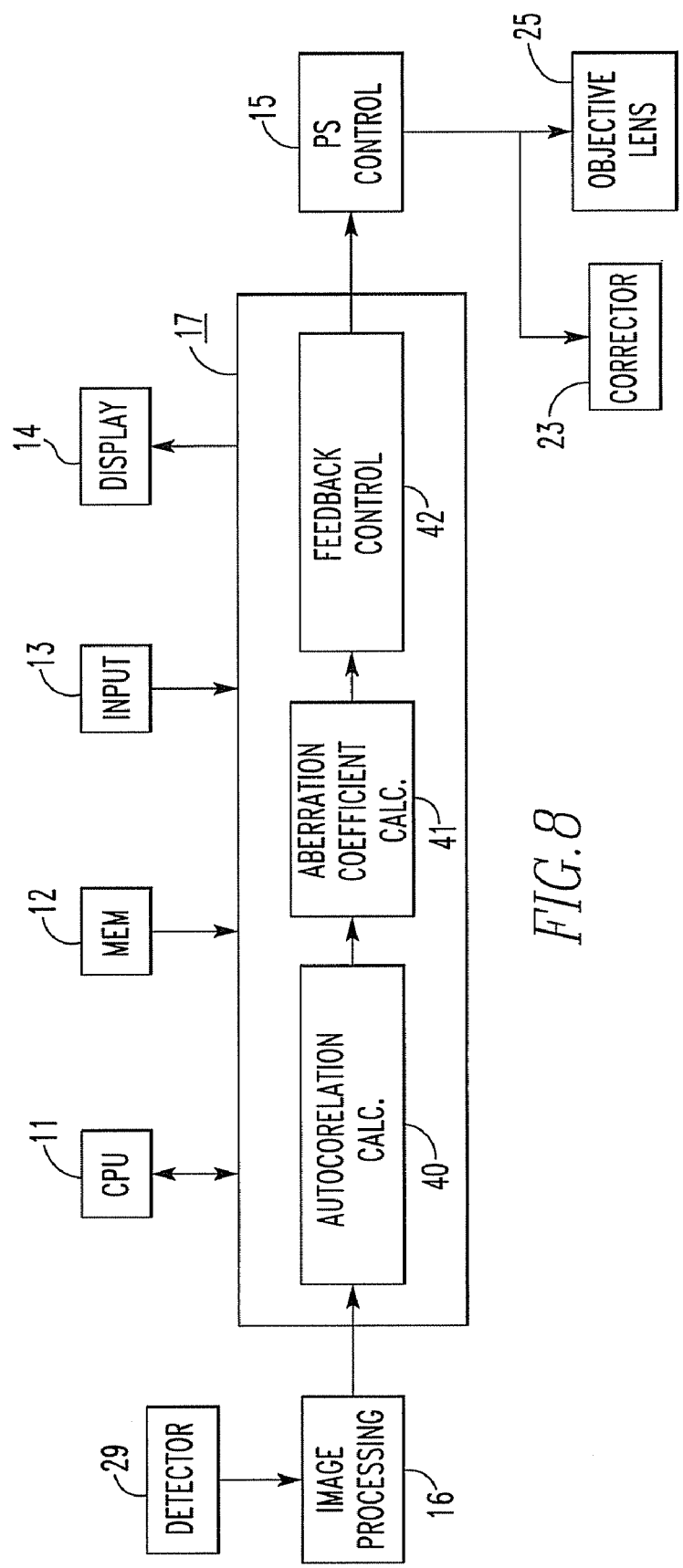
FIG. 8 is a functional block diagram of an aberration correction system associated with one embodiment of the present invention.

FIG. 8 is a functional block diagram illustrating the processing for aberration correction associated with one embodiment of the present invention. In both FIGS. 1 and 8, like components are indicated by like reference numerals.

Processing performed when an STEM image is obtained is first described. The program stored in the memory storage 12 and used to control the STEM 2 is executed by the CPU 11. Imaging is started. At this time, the values of currents or voltages applied to the electron lenses 25, 27, 28, aberration corrector 23, and deflector 24 are set from the input portion 13 or from the memory storage 12 via the power supply control portion 15. For example, in acquiring a dark-field image in step S1 or S3, a human operator enters focus values i and i' through the input portion 13. Based on the entered values, the focal distance of the objective lens 25 is set. The output signal from the detector 29 is converted into image data by the image processing portion 16 and then stored into the memory storage 12. Concomitantly, a final image is displayed on the display portion 14.

The processing of aberration correction associated with the present embodiment is next described. The aberration correction processing portion 17 has autocorrelation calculation means 40, aberration coefficient calculation means 41, and feedback control 42.

The autocorrelation calculation means 40 calculates autocorrelation functions 51 and 52 using the image data. The calculated functions 51 and 52 are stored in the memory storage 12.

The aberration coefficient calculation means 41 fits aberration functions given by Eqs. (5) and (6), respectively, to the iso-intensity lines 53 and 54 in the autocorrelation functions 51 and 52. A method of least squares is used for the fitting. As a result, the aberration coefficient $o_2$, $a_2$ and proportionality coefficient k are calculated.

The feedback control 42 provides feedback control using the calculated coefficients to vary the values at which the objective lens and aberration corrector are set, to cancel out the presently produced aberrations. That is, an optimal focus value is obtained based on the aberration coefficient $o_2$. The value is set into the objective lens 25 via the power supply control portion 15. As a result, the defocus is removed. On the other hand, a value that cancels out the aberration is obtained from the aberration coefficient $a_2$. The value is set into the aberration corrector 23 via the power supply control portion 15. Consequently, an image free of two-fold astigmatism is obtained.

In the processing of aberration correction associated with the present embodiment, at least two images obtained at different focus values are used. Accordingly, aberration correction can be performed during imaging. In consequence, successive aberration corrections can be performed without losing the observed region.

The processing of aberration correction associated with the present embodiment also enables automated control. During high-resolution imaging where atomic images are obtained, two arbitrary focus values are set automatically. The sequence of operations for aberration correction illustrated in FIG. 2 is repeated. As a result, images free of defocus and two-fold astigmatism are obtained at all times. As a result, good quality data can be obtained without deteriorating the spatial resolution in EDS (energy dispersive spectroscopy) and EELS imaging applications where long-term accumulation of data is necessary.

In the above embodiment, the value at which the objective lens is set is varied to correct aberrations. It is to be noted that the aberration correction of the present invention is not limited to an objective lens that is set to a variable value. That is, other electron optical devices capable of varying the focal point or specimen stage may be set to a variable value. Feedback control of the variable value may be provided. In addition, the focus may be similarly varied by a combination thereof.

In addition, in the present embodiment, the aberration correction system is incorporated in the controller 1 that performs normal imaging. The aberration correction system may be physically separated from the controller. For instance, final images and autocorrelation functions may be displayed when aberrations are corrected. A dedicated input portion for entering corresponding values at which the electron optical devices are set may be mounted. Also, a dedicated aberration correction control portion may be mounted. These portions make communications with the controller to permit indirect control of the STEM.

The aberration corrector 23 mounted inside the STEM 2 may be located between the electron gun 22 and the specimen stage 26. The position of the corrector 23 is not limited to the position shown in FIG. 1.

Having thus described my invention in the detail and particularity required by the Patent Laws, what is desired protected by Letters Patent is set forth in the following claims.

The invention claimed is:

1. A scanning transmission electron microscope having plural electron optical means including an aberration corrector, said scanning transmission electron microscope comprising:
   autocorrelation function calculation means for calculating autocorrelation functions of at least two images, respectively, obtained at different foci;
   aberration coefficient calculation means for fitting aberration functions to iso-intensity lines of the autocorrelation functions and calculating aberration coefficients based on obtained aberration functions; and
   feedback control means for providing feedback control of the plural electron optical means based on the aberration coefficients.

2. A scanning transmission electron microscope as set forth in claim 1, wherein said aberration coefficients represent defocus and two-fold astigmatism, respectively.

3. A scanning transmission electron microscope as set forth in claim 1 or 2, wherein said feedback control means controls an objective lens included in said electron optical means.

4. A scanning transmission electron microscope as set forth in claim 1, wherein said feedback control means controls the aberration corrector included in said electron optical means.

5. A scanning transmission electron microscope as set forth in claim 4, wherein said aberration corrector is an aberration corrector for correcting two-fold astigmatism.

6. A method of correcting aberrations in a scanning transmission electron microscope having plural electron optical means including an aberration corrector, said method comprising the steps of:
   acquiring at least two images at different foci;
   calculating autocorrelation functions of the images, respectively;
   fitting aberration functions to iso-intensity lines of said autocorrelation functions;
   calculating aberration coefficients based on obtained aberration functions; and
   providing feedback control of the plural electron optical means based on the aberration coefficients.

7. A method of correcting aberrations in a scanning transmission electron microscope having plural electron optical means including an aberration corrector, said method comprising the steps of:
- setting angled regions equivalent to tilted illumination of an incident electron beam;
- acquiring at least two images from the angled regions;
- calculating autocorrelation functions from the images, respectively;
- fitting aberration functions to iso-intensity lines of the autocorrelation functions;
- calculating aberration coefficients based on obtained aberration functions; and
- providing feedback control of the plural electron optical means based on the aberration coefficients.

8. A method of correcting aberrations in a scanning transmission electron microscope as set forth in claim 6 or 7, wherein said aberration coefficients represent defocus and two-fold astigmatism, respectively.

* * * * *